(12) United States Patent
Kruchowy et al.

(10) Patent No.: US 6,459,270 B1  
(45) Date of Patent: Oct. 1, 2002

(54) METHOD FOR TESTING HIGH VOLTAGE BREAKDOWN AND LEAKAGE CURRENT OF ELECTRICAL CABLES

(75) Inventors: Roman Kruchowy, Somis, CA (US); Ian Stewart, Ventura, CA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 45 days.

(21) Appl. No.: 09/630,324

(22) Filed: Jul. 31, 2000

(51) Int. Cl.[7] ............................................. G01R 31/08
(52) U.S. Cl. ...................................... 324/514; 324/551
(58) Field of Search ................................. 324/541, 544, 324/509, 551, 557, 540

(56) References Cited

U.S. PATENT DOCUMENTS

| | | | | |
|---|---|---|---|---|
| 3,594,635 A | * | 7/1971 | Mitsuo | 324/541 |
| 3,771,049 A | * | 11/1973 | Piccione | 324/542 |
| 4,164,771 A | * | 8/1979 | Heinrich | 324/509 |
| 4,937,519 A | * | 6/1990 | Fields, III | 324/540 |
| 5,528,152 A | * | 6/1996 | Hinoshita et al. | 324/539 |

* cited by examiner

Primary Examiner—Ernest Karlsen  
(74) Attorney, Agent, or Firm—David Kalmbaugh

(57) ABSTRACT

A method for testing a cable for defective insulation. A user connects one end of each cable conductor to a numbered terminal block. The user measures the insulation resistance between the first and second conductors of the cable using an insulation resistance tester. Next, the user shorts conductors one and two at the terminal block. The user then measures the insulation resistance between the first and third conductors. Measuring the insulation resistance between conductors one and three also measures the insulation resistance between conductors two and three. The user continues these steps until the insulation resistance for all conductors is measured.

1 Claim, 3 Drawing Sheets

METHOD FOR TESTING HIGH VOLTAGE BREAKDOWN AND LEAKAGE CURRENT OF ELECTRICAL CABLES

BACKGROUND OF THE INVENTION

1. Field of the Invention

The present invention relates generally to the testing of electrical cables. More particularly, the present invention relates to a method for testing high voltage breakdown and current leakage of the insulation for the electrical conductors within an electrical cable.

2. Description of the Prior Art

In the communications and similar industries, billions of feet of insulated metallic conductors for use in cables are manufactured each year. These conductors have multiple uses. For example, these metallic conductors can be used to connect distributing frames inside central offices, as inside wiring to provide service to customer station apparatus, and other like applications.

Insulation which covers metallic conductors within a cable must be relatively free of defects if it is to prevent shorting of adjacent conductors and ground when the conductors are placed into service. Accordingly, in the manufacture of insulated conductors for use in a cable, it is customary to test the insulation for defects. Defects may include uninsulated portions of the conductor as well as splints in the insulation or inadequate thickness of the insulation. Depending upon the kinds of defects and the number of each in a given length of cable, the insulated conductors the cable may be rejected for use.

Generally, in the past the testing of electrically cables for inter-conductor current leakage and high voltage breakdown required a considerable amount of time when multiple conductors were being tested.

For example, in the past a cable insulation resistance test was performed using a high voltage insulation resistance meter. One lead of the meter was attached to one conductor of the cable being tested, while the other lead of the meter was attached to a second conductor of the cable being tested. A high voltage is then applied and the insulation resistance between the two conductors is measured by the meter.

When a multi-conductor cable is being tested to verify that the insulation is in good condition, it is generally necessary to perform a high voltage insulation resistance test on every conductor with respect to every other conductor within the cable. This results in the number of combinations of n distinct conductors taken m conductors at a time given by the expression:

$$\binom{n}{m} = C(n, m) \qquad (1)$$

The following table depicts the number of high voltage insulation resistance test that must be performed to completely test a cable having n conductors within the cable.

TABLE I

| n<br>Number of Conductors in the cable | Number of high voltage insulation resistance test needed to test the cable |
| --- | --- |
| 5 | 10 |
| 10 | 45 |
| 15 | 105 |
| 20 | 190 |
| 25 | 300 |
| 30 | 435 |
| 35 | 595 |
| 40 | 780 |
| 45 | 990 |
| 50 | 1225 |

As can be seen from Table I, when the number of conductors approaches 15, the number of high voltage insulation resistance test required to thoroughly test a cable for defective insulation becomes significant and therefore highly impractical. For example, when the cable has thirty conductors, the number of test required for testing the cable is 435.

Accordingly, there is a need for a procedure to test the insulation in cables which will not be time consuming and thus costly and which will provide a very efficient and thorough method for testing installation in a multi-conductor cable.

SUMMARY OF THE INVENTION

The present invention overcomes some of the difficulties of the past including those mentioned above in that it comprises a relatively simple yet highly efficient and inexpensive method for testing multi-conductor cables for current leakage and high voltage breakdown of the insulation for the electrical conductors within the cable.

For a multi-conductor cable having a plurality of conductors, the method of the present invention requires a user to connect one end of each conductor to a numbered terminal block. At the opposite end of the cable, the user then measures the insulation resistance between the first and second conductors of the cable using a voltage insulation resistance tester.

After measuring the insulation resistance between conductors one and two, the user shorts conductor one to conductor two at the terminal block using a jumper wire. At the opposite end of the cable, the user then measures the insulation resistance between the first and third conductors of the cable using the voltage insulation resistance tester. Since conductors one and two are shorted at the terminal block, measuring the insulation resistance between conductor one and conductor two also measures the insulation resistance between conductors two and three.

The user continues the above-identified steps until all of the conductors are shorted together except for the last conductor of the cable for which the user has not measured the insulation resistance. The user then measures the insulation resistance between the first and last conductors of the cable using the voltage insulation resistance tester. Measuring the insulation resistance between conductor one and the last conductor also measures the insulation resistance between the last conductor and every other conductor within the cable.

DETAILED DESCRIPTION OF THE PREFERRED EMBODIMENT

Figure 1:
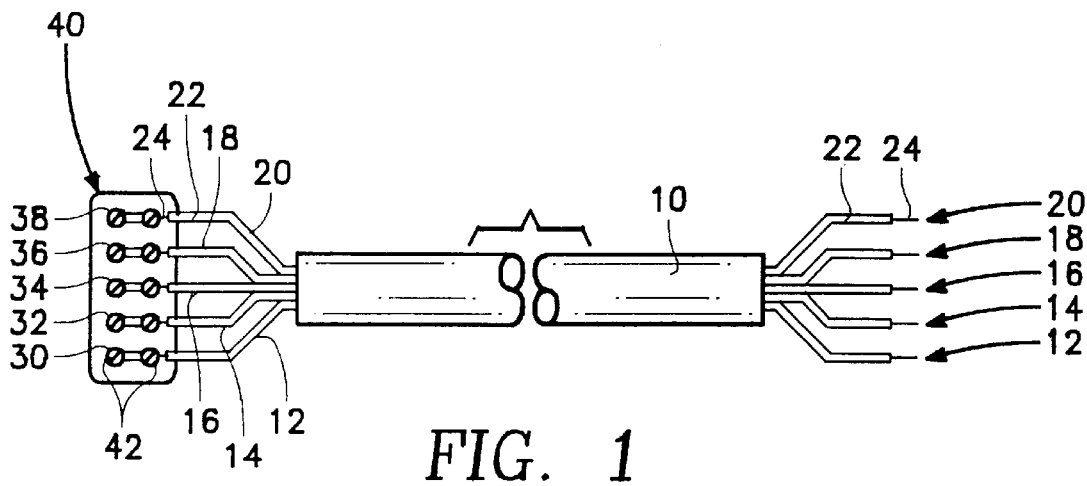
FIGS. 1–5 illustrate the method of the present invention which is used to test for defective insulation within a multi-conductor.

Referring to FIGS. 1–5, there is shown a method for detecting the presence of insulation which is defective within a multi-conductor cable. In FIG. 1 there is shown a multi-conductor cable 10 which has five conductors 12, 14, 16, 18 and 20. Each conductor 12, 14, 16, 18 and 20 of cable 10 is insulated by an insulation material 22 which surrounds a copper wire 24 within the conductor. When a high voltage (for example 110–4400 volts) is applied to any or all of the conductors 12, 14, 16, 18 and 20 of cable 10 inter-conductor current leakage between conductors may occur because of insulation defects within the insulation material 22 for the conductors 12, 14, 16, 18 and 20.

Figure 2:
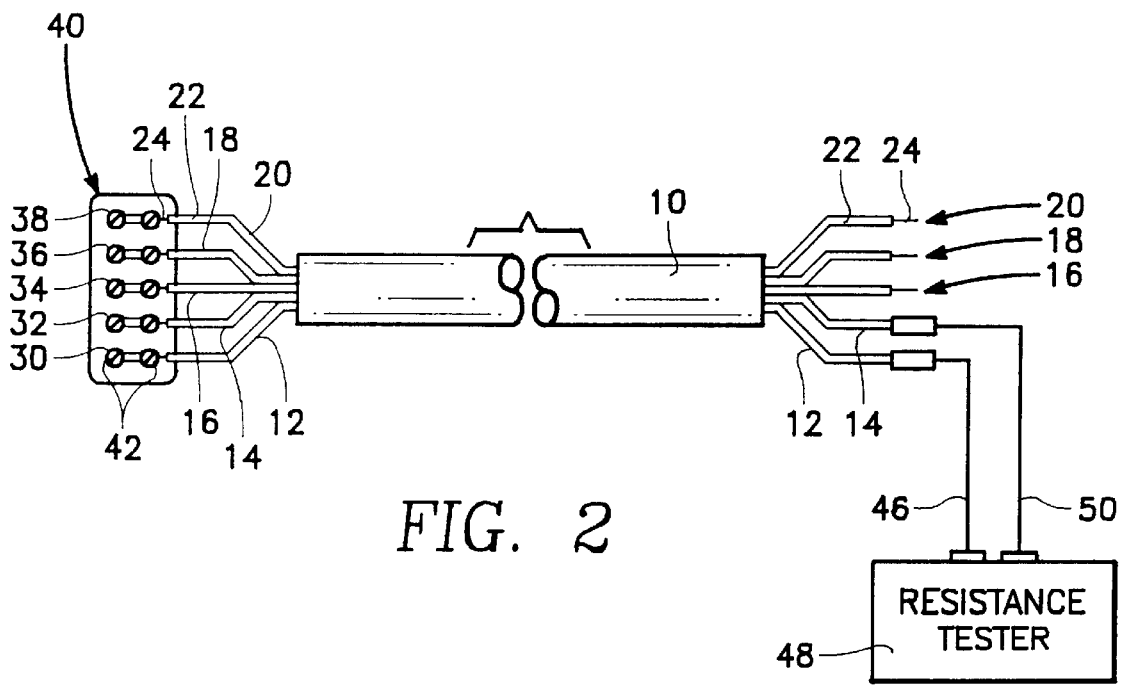

Referring to FIG. 2, to utilize the method of the present invention to test for defects within the insulation material 22 of each of the conductors 12, 14, 16, 18 and 20, the user attaches one end of the copper wire 24 of each conductors 12, 14, 16, 18 and 20 to a terminal 30, 32, 34, 36 or 38 of a numbered terminal block 40. Each terminal 30, 32, 34, 36 and 38 of terminal block 40 has a pair of metallic terminal screws 42, with the terminal screw 42 on the right side of each terminal 30, 32, 34, 36 and 38 of terminal block 40 being connected to one end of the copper wire 24 of one of the conductors 30, 32, 34, 36 and 38 of cable 10.

As shown in FIG. 2, the copper wire 24 of conductor 12 is connected to terminal 30 of terminal block 40, while the copper wire 24 of conductor 14 is connected to terminal 32 of terminal block 40. Lead 46 of a high voltage insulation resistance tester 48 is connected to conductor 12, while lead 50 of voltage insulation resistance tester 48 is connected to conductor 14. The user then measures the insulation resistance between conductor 12 and conductor 14 using voltage insulation resistance tester 10.

Figure 3:
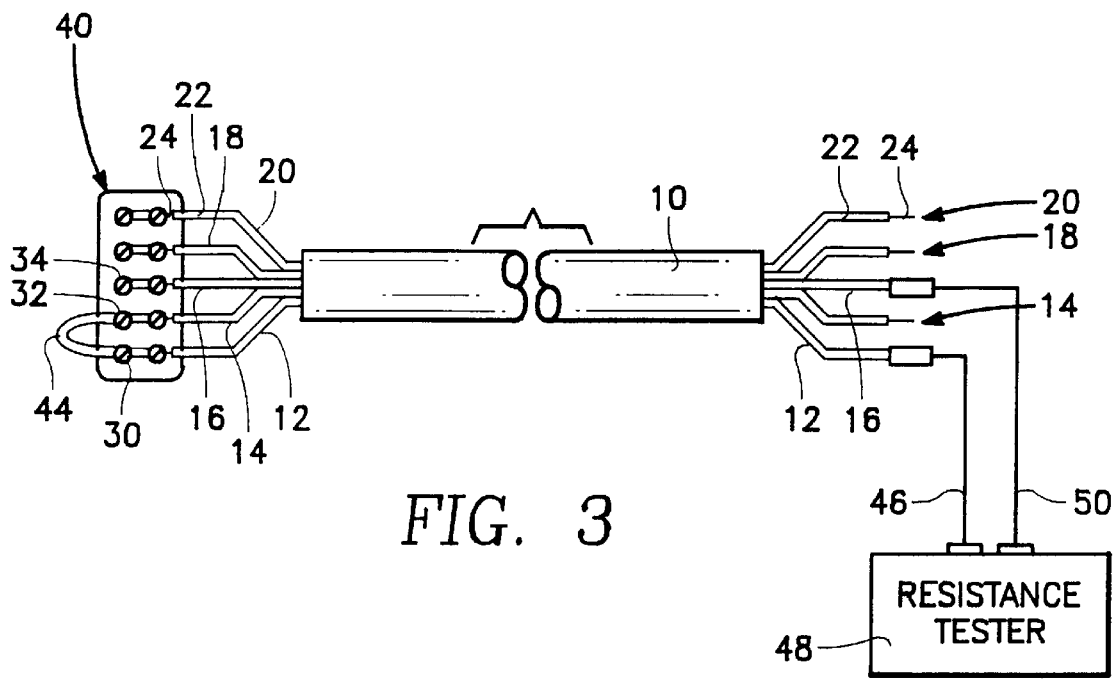
Figure 4:
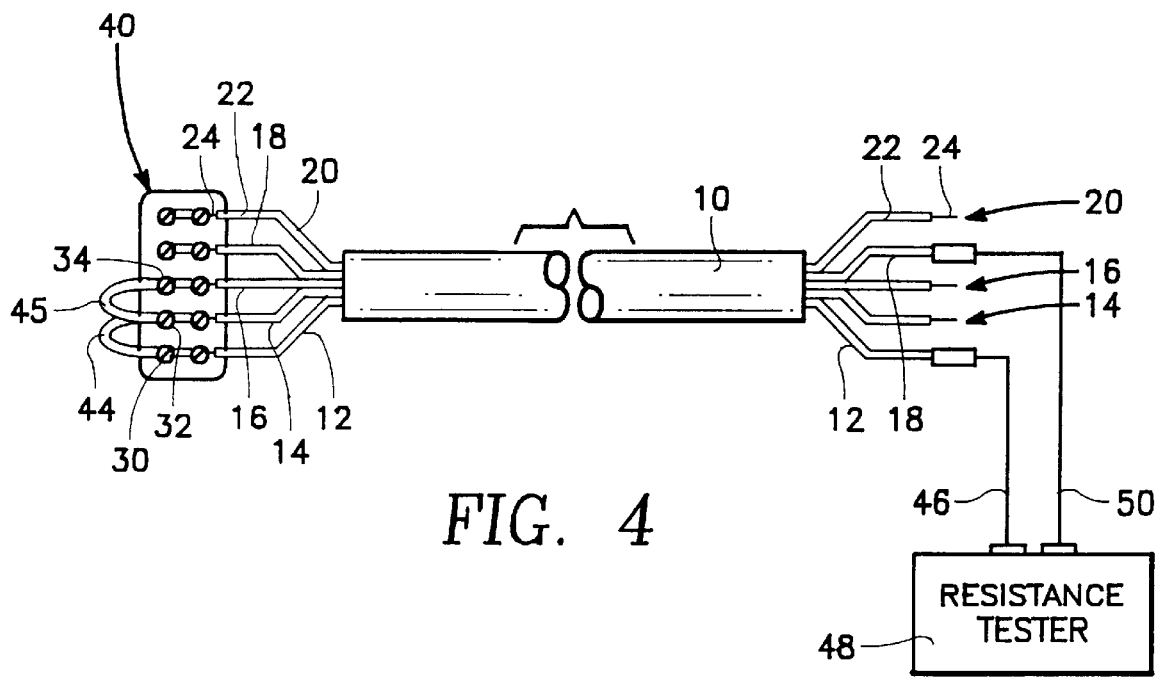

Referring to FIG. 3, the user utilizes a shorting/jumper wire 44 to connect terminal 30 of terminal block 40 to terminal 32 of terminal block 40. Lead 46 of a voltage insulation resistance tester 48 is connected to conductor 12, while lead 50 of voltage insulation resistance tester 48 is connected to conductor 16. The user then measures the insulation resistance between conductor 12 and conductor 16 using voltage insulation resistance tester 10. Since conductors 12 and 14 are shorted at terminal block 40 by shorting wire 44 the insulation resistance measured between conductors 12 and 16 also measures the insulation resistance between conductor 14 and conductor 16.

Referring to FIG. 4, the user again connects terminal 30 of terminal block 40 to terminal 32 of terminal block 40 using shorting wire 44. The user also connects terminal 30 of terminal block 40 to terminal 32 of terminal block 40 using a shorting wire 45. The user then measures the insulation resistance between conductor 12 and conductor 18 using voltage insulation resistance tester 48. Since conductors 12, 14 and 16 are shorted at terminal block 40 by shorting wires 44 and 45 the insulation resistance measured between conductors 12 and 18 also measures the insulation resistance between conductor 14 and conductor 18, as well as the insulation resistance between conductor 16 and conductor 18.

Figure 5:
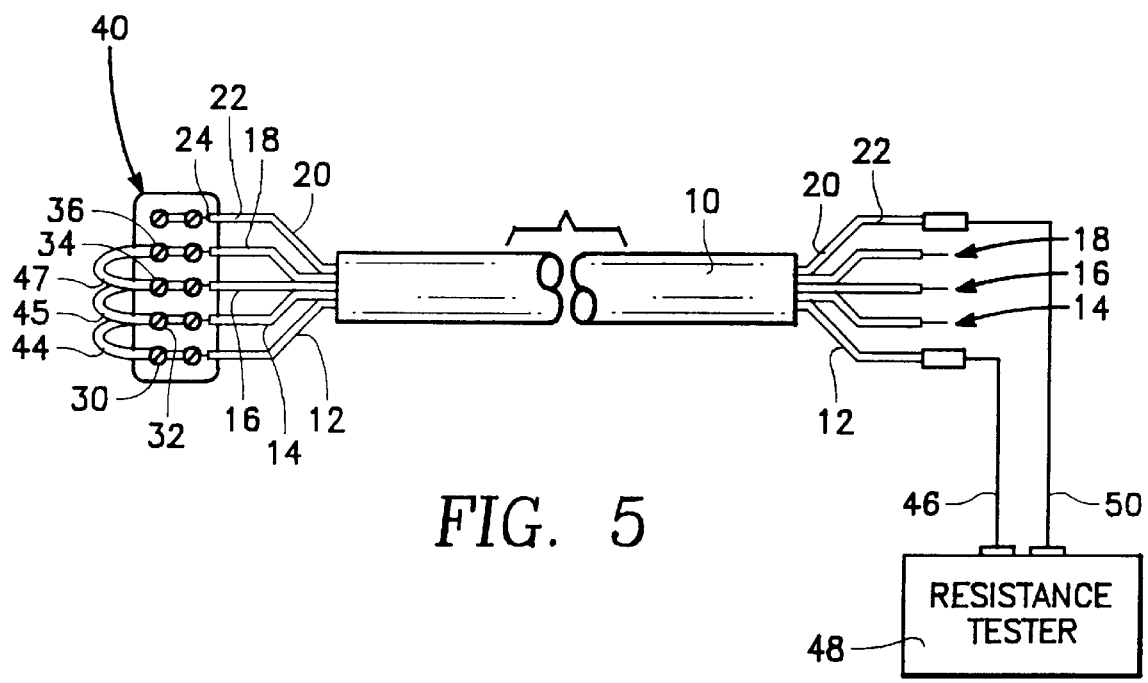

Referring to FIG. 5, the user connects terminal 30 to terminal 32 using shorting wire 44, terminal 32 to terminal 34 using shorting wire 45 and terminal 34 to terminal 36 using shorting wire 47. The user then measures the insulation resistance between conductor 12 and conductor 20 using voltage insulation resistance tester 48. Since conductors 12, 14, 16 and 18 are shorted at terminal block 40 by shorting wires 44, 45 and 46 the insulation resistance measured between conductors 12 and 20 also measures the insulation resistance between conductor 14 and conductor 20, as well as the insulation resistance between conductor 16 and conductor 20 and the insulation resistance between conductor 18 and conductor 20.

Thus, it can readily be seen that use of the method of the present saves a substantial amount of time in testing the five conductor cable 10. The conductors 12, 14, 16, 18 and 20 of cable 10 are tested with respect to every conductor of cable 10 for defective insulation by making only four insulation resistance test using voltage insulation resistance tester 48.

For a cable having four conductors, the first test would measure insulation resistance between conductors 1 and 2; the second test would measure insulation resistance between conductors 1 and 3 as well as conductors 2 and 3; and the third test would measure insulation resistance between conductors 1 and 4 as well as conductors 2 and 4 and conductors 3 and 4. In the past six test were required to thoroughly check the conductor insulation of a four conductor cable for defects.

The following table illustrates the time reduction using the method of the present invention to test for defective insulation within a multi-conductor cable.

TABLE II

| Number of conductors in the cable | Number of high voltage resistance test to test the cable | Time reduction using new method (%) |
|---|---|---|
| 5 | 4 | 60 |
| 10 | 9 | 80 |
| 15 | 14 | 87 |
| 20 | 19 | 90 |
| 25 | 24 | 92 |
| 30 | 29 | 93 |
| 35 | 34 | 94 |
| 40 | 39 | 95 |
| 45 | 44 | 95 |
| 50 | 49 | 96 |

As can be seen from Tables I and II, when testing a twenty conductor cable using the method of the present invention nineteen high voltage resistance test are required to thoroughly check the conductor insulation for defects. From Table I it can be seen that one hundred ninety test were required to check cable insulation in the past. The method of the present invention, in turn, results in a 90% time reduction in checking for defective insulation within a twenty conductor cable.

From the foregoing, it may readily be seen that the present invention comprises a new, unique and exceedingly useful method for testing for defective insulation within a multi-conductor cable which constitutes a considerable improvement over the known prior art. Many modifications and variations of the present invention are possible in light of the above teachings. It is to be understood that within the scope of the appended claims the invention may be practiced otherwise than as specifically described.

What is claimed is:

1. A method for detecting defects in an insulation for each of n conductors in a cable, said method comprising the steps of:

(a) connecting one end of each of said n conductors to a terminal of a terminal block, wherein said n conductors of said cable comprise a range of from thirteen conductors to fifty conductors within said cable;

(b) attaching a first lead of an insulation resistance tester to a first of said n conductors and a second lead of said insulation resistance tester to a second of said n conductors;

(c) measuring an insulation resistance between the first of said n conductors and the second of said n conductors using said insulation resistance tester;

(d) shorting the first of said n conductors to the second of said n conductors at said terminal block by attaching one end of a first jumper wire to the terminal of said terminal block associated with the first of said n conductors and an opposite end of said first jumper wire to the terminal of said terminal block associated with the second of said n conductors;

(e) attaching the second lead of said insulation resistance tester to a third of said n conductors;

(f) measuring the insulation resistance between the first of said n conductors and the third of said n conductors using said insulation resistance tester;

(g) repeating steps d, e and f for each successive conductor of said n conductors until n−1 conductors of said n conductors are shorted to one another;

(h) measuring an insulation resistance between the first of said n conductors and a last of said of n conductors after shorting said n−1 conductors of said n conductors to one another, said method providing for a time reduction of at least sixty percent over a time period required to detect said defects in said insulation for each of said n conductors using a conventional method which requires that each of said n conductors be tested with a remainder of said n conductors to detect said defects in said insulation of said cable.

* * * * *